(12) United States Patent
Jeon

(10) Patent No.: US 10,062,635 B2
(45) Date of Patent: Aug. 28, 2018

(54) DOUBLE-FACED COOLING-TYPE POWER MODULE

(71) Applicant: Hyundai Motor Company, Seoul (KR)

(72) Inventor: Woo Yong Jeon, Seoul (KR)

(73) Assignee: Hyundai Motor Company, Seoul (KR)

( * ) Notice: Subject to any disclaimer, the term of this patent is extended or adjusted under 35 U.S.C. 154(b) by 0 days.

(21) Appl. No.: 15/262,969

(22) Filed: Sep. 12, 2016

(65) Prior Publication Data
US 2017/0323847 A1 Nov. 9, 2017

(30) Foreign Application Priority Data

May 4, 2016 (KR) .......................... 10-2016-0055331

(51) Int. Cl.
H01L 23/373 (2006.01)
H01L 23/433 (2006.01)
H01L 23/495 (2006.01)
H01L 23/051 (2006.01)
H01L 23/31 (2006.01)

(52) U.S. Cl.
CPC ........ *H01L 23/373* (2013.01); *H01L 23/3735* (2013.01); *H01L 23/4334* (2013.01); *H01L 23/49562* (2013.01); *H01L 23/49575* (2013.01); *H01L 23/051* (2013.01); *H01L 23/3107* (2013.01); *H01L 23/49531* (2013.01); *H01L 2224/33* (2013.01); *H01L 2224/40137* (2013.01); *H01L 2224/48091* (2013.01); *H01L 2224/48247* (2013.01); *H01L 2224/73265* (2013.01)

(58) Field of Classification Search
CPC .......................... H01L 23/49568; H01L 24/28
See application file for complete search history.

(56) References Cited

U.S. PATENT DOCUMENTS

2006/0044771 A1* 3/2006 Yeo ..................... H01L 23/4334
361/761
2013/0020694 A1* 1/2013 Liang .................... H01L 25/072
257/691

FOREIGN PATENT DOCUMENTS

| EP | 2704193 A1 * | 3/2014 | ....... H01L 23/49548 |
|---|---|---|---|
| JP | 2006-134990 A | 5/2006 | |
| JP | 2007-215396 A | 8/2007 | |
| JP | 2007-311441 A | 11/2007 | |
| JP | 2012-146760 A | 8/2012 | |
| JP | 2013-149730 A | 8/2013 | |

* cited by examiner

*Primary Examiner* — Moazzam Hossain
*Assistant Examiner* — Farun Lu
(74) *Attorney, Agent, or Firm* — Mintz, Levin Cohn Ferris Glovsky and Popeo, P.C.; Peter F. Corless

(57) ABSTRACT

A double-facing cooling-type power module has coolers on both sides. The power module includes: a first switch having the coolers on both sides; a second switch disposed independently from the first switch and having the coolers on both sides; and a common electrode coupled to both the first switch and the second switch.

10 Claims, 4 Drawing Sheets

DOUBLE-FACED COOLING-TYPE POWER MODULE

CROSS REFERENCE TO RELATED APPLICATION

The present application claims under 35 U.S.C. § 119(a) the benefit of Korean Patent Application No. 10-2016-0055331, filed May 4, 2016, the entire contents of which are incorporated by reference herein.

BACKGROUND

1. Field of the Invention

The present invention relates to a double-faced cooling-type power module, and more particularly, to a double-faced cooling-type power module including coolers on both sides and a pair of switches.

2. Description of the Related Art

Power modules are used for driving motors in hybrid vehicles and electric vehicles. In general, a power module with six switches is used to drive one motor, each of the switches being composed of an insulated-gate bipolar transistor (IGBT) and a diode, and controlling the flow of current by transmitting operation signals.

FIG. 1 (RELATED ART) shows the configuration of such a power module. As shown in FIG. 1, a semiconductor chip composed of an IGBT and a diode is installed in a switch, and these two switches constitute one unit. One switch is connected to each of first wire A and a second wire B that are connected to a battery, and the switches are connected to a third wire C connected to a motor.

A double-faced cooling-type power module, in which a substrate is mounted on a top and a bottom of a semiconductor, and a cooler is mounted on outer sides of the substrates, has higher cooling performance than common one-sided cooling power modules, and can be manufactured in a more compact size, such that a double-faced cooling-type power module is being extensively used.

Further, as shown in FIG. 2 (RELATED ART), a double-faced cooling-type power module of the related aft is manufactured by sequentially stacking a first substrate 11 or a third substrate 13, a semiconductor chip 20, a spacer 30, and a third substrate 13 or a second substrate 12, where these components are combined by disposing solder material 40 between the components and soldering them.

The semiconductor chip 20 is partially exposed out of the solder material 40, and a wire 60 for transmitting/receiving a control signal for the semiconductor chip 20 is connected to the exposed surface. Signals that are transmitted and/or received through the wire 60 are transmitted through a lead frame 50.

There is a need for a space having a predetermined height for installation of the wire 60, and a spacer 30 is provided to ensure the space.

However, the spacer 30 has relatively large thermal and electrical resistance, and the resistance has an adverse influence on cooling ability and signal transmission ability, and moreover, one spacer 30 is required for each switch, thus increasing manufacturing costs.

Therefore, there is a need for a double-faced cooling-type power module that can be manufactured in a small size with a simple package structure and has minimal thermal and electrical resistance.

SUMMARY

The present invention provides a double-faced cooling-type power module including a power module unit, composed of a pair of switches, which can be manufactured in a more compact size by replacing a spacer with a common electrode.

A double-facing cooling-type power module according to an embodiment of the present invention includes: a first switch having coolers on both sides; a second switch disposed independently from the first switch and having coolers on both sides; and a common electrode coupled to both the first switch and the second switch.

The first switch may be formed by stacking a first semiconductor chip and the common electrode between a first substrate connected to a battery and a third substrate connected to a motor, the second switch may be formed by stacking the common electrode and a second semiconductor chip between a third substrate connected to a motor and a second substrate connected to a battery, and the common electrode may be stacked in both the first switch and the second switch and may be connected to the third substrate.

The first switch and the second switch may be formed to have opposite shapes, and the first substrate of the first switch and the third substrate of the second switch may be positioned in the same plane.

The first substrate, the first semiconductor chip, the common electrode, and the third substrate of the first switch may be bonded by soldering, and the third substrate, the common electrode, the second semiconductor chip, and the second substrate of the second switch may be bonded by soldering.

The first substrate of the first switch and the third substrate of the second switch may be separate substrates, and the third substrate of the first switch and the second substrate of the second switch may be separate substrates.

The first substrate may be made wider than the third substrate in the first switch, and the third substrate may be made wider than the second substrate in the second switch.

The first, second, and third substrates may each be composed of an outer layer made of copper or aluminum and being in contact with the cooler, an inner layer made of copper or aluminum and being in contact with the first semiconductor chip, the second semiconductor chip, or the common electrode, and an intermediate layer made of ceramic between the outer layer and the inner layer; the outer layer and the intermediate layer may be integrated and the inner layer may be divided, in the first substrate of the first switch and the third substrate of the second switch; and the outer layer and the intermediate layer may be integrated and the inner layer may be divided, in the third substrate of the first switch and the second substrate of the second switch.

A substrate formed by integrating the first substrate of the first switch and the third substrate of the second switch may be made wider than a substrate formed by integrating the third substrate of the first switch and the second substrate of the second switch.

The first switch and the second switch may be sealed using a sealant made of an epoxy-molding compound or a silicon gel.

The power module may further include wires connected to the first semiconductor chip and the second semiconductor chip, respectively, to transmit and receive signals.

The common electrode may be a lead frame or a thin plate made of copper or aluminum.

The double-faced cooling power module of the present invention has the following effects.

First, since there is no spacer, it is possible to prevent a reduction in cooling efficiency and electrical conductivity efficiency due to a spacer.

Second, since the power module can be manufactured in a more compact size, the volume can be reduced.

Third, it is possible to simplify the circuit structure of the power module.

BRIEF DESCRIPTION OF THE DRAWINGS

The above and other objects, features and other advantages of the present invention will be more clearly understood from the following detailed description when taken in conjunction with the accompanying drawings, in which.

DETAILED DESCRIPTION OF THE INVENTION

It is understood that the term "vehicle" or "vehicular" or other similar term as used herein is inclusive of motor vehicles in general such as passenger automobiles including sports utility vehicles (SUV), buses, trucks, various commercial vehicles, watercraft including a variety of boats and ships, aircraft, and the like, and includes hybrid vehicles, electric vehicles, plug-in hybrid electric vehicles, hydrogen-powered vehicles and other alternative fuel vehicles (e.g. fuels derived from resources other than petroleum). As referred to herein, a hybrid vehicle is a vehicle that has two or more sources of power, for example both gasoline-powered and electric-powered vehicles.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Throughout the specification, unless explicitly described to the contrary, the word "comprise" and variations such as "comprises" or "comprising" will be understood to imply the inclusion of stated elements but not the exclusion of any other elements. In addition, the terms "unit", "-er", "-or", and "module" described in the specification mean units for processing at least one function and operation, and can be implemented by hardware components or software components and combinations thereof.

Further, the control logic of the present invention may be embodied as non-transitory computer readable media on a computer readable medium containing executable program instructions executed by a processor, controller or the like. Examples of computer readable media include, but are not limited to, ROM, RAM, compact disc (CD)-ROMs, magnetic tapes, floppy disks, flash drives, smart cards and optical data storage devices. The computer readable medium can also be distributed in network coupled computer systems so that the computer readable media is stored and executed in a distributed fashion, e.g., by a telematics server or a Controller Area Network (CAN).

Hereinafter, double-faced cooling-type power modules according to embodiments of the present invention are described in detail with reference to the accompanying drawings.

Figure 1:
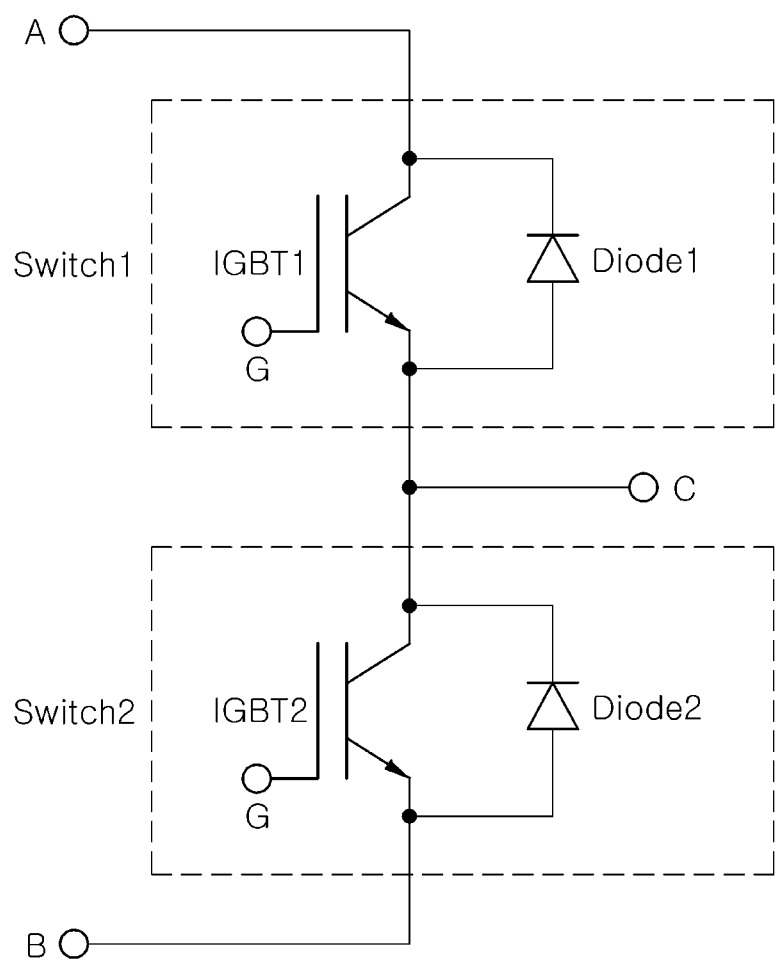
FIG. 1 (RELATED ART) is a diagram simply showing the configuration of a common 2-switch power module.
Figure 2:
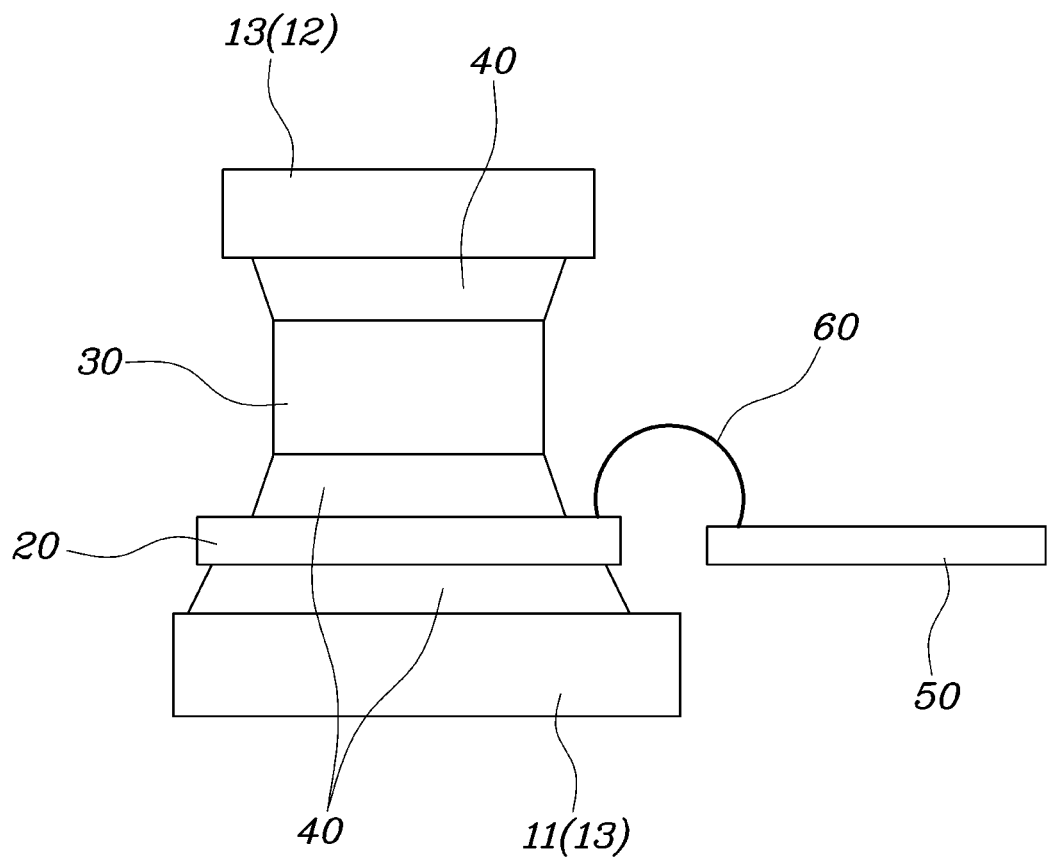
FIG. 2 (RELATED ART) is a view showing a conventional double-faced cooling-type power module.
Figure 3:
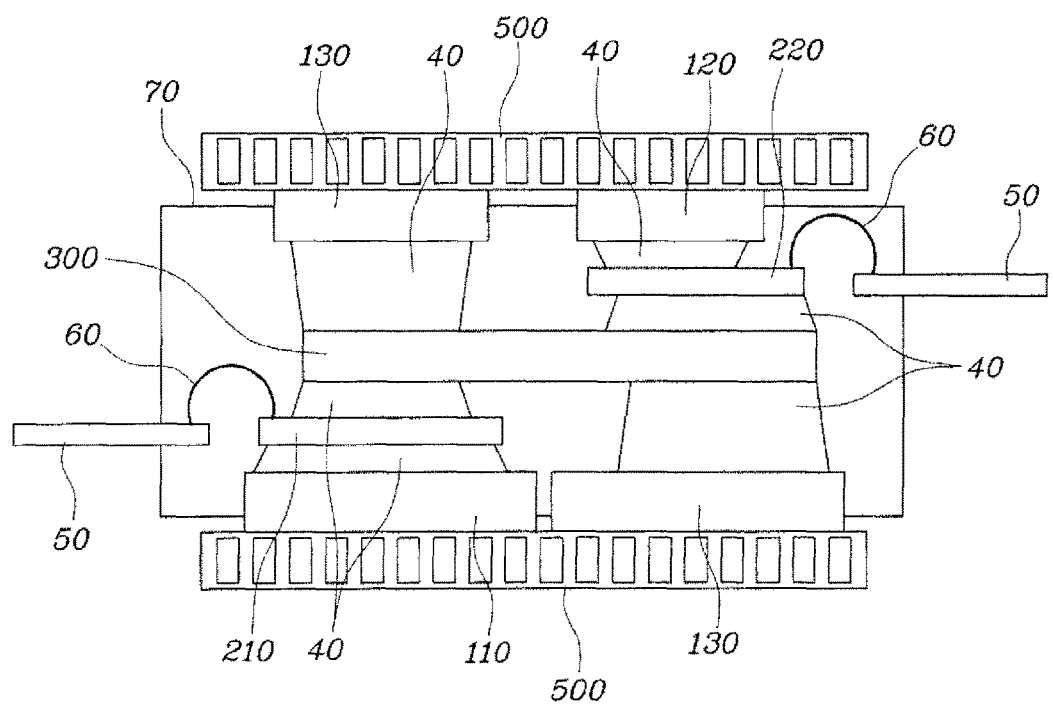
FIG. 3 is a view of a double-faced cooling-type power module according to an embodiment of the present invention.

As shown in FIGS. 1 to 3, the present invention relates to a double-faced cooling-type power module with coolers 500 on both sides, where the double-faced cooling-type power module includes a first switch, a second switch provided independently from the first switch, and a common electrode 300 coupled to both the first switch and the second switch.

A cooler 500 is disposed on both sides of each of the first switch and the second switch and removes resistance heat. That is, the coolers 500 remove heat transmitted through the sides from semiconductors in the first switch and the second switch.

The first switch is a stacked structure formed by components located between a first substrate 110 and a third substrate 130; that is, the first substrate 110, a first semi-conductor chip 210, a common electrode 300, and a third substrate 130 are sequentially stacked.

Similarly, the second switch is a structure formed by sequentially stacking a third substrate 130, the common electrode 300, a second semiconductor chip 220, and a second substrate 120.

The first substrate 110 and the second substrate 120 are respectively connected to a battery (not shown), while the third substrate 130 is connected to a motor (not shown).

The common electrode 300, which is coupled to both the first switch and the second switch, physically and electrically connects the first and second switches. The common electrode 300 is also connected to the third substrate 130 and transmits signals to the motor.

The common electrode may be made of the same material as those of existing lead frames, or it may be a thin plate made of copper or aluminum. When the common electrode is a thin plate made of copper or aluminum, thermal transfer efficiency is increased, such that cooling efficiency may be improved and the thickness of the power module (i.e., the double-faced cooling-type power module) may be decreased.

The power module may further include wires 60 connected to the first semiconductor chip 210 and the second semiconductor chip 220, respectively, to transmit and/or receive signals. The wires 60 are connected to lead frames 50 to transmit and/or receive control signals.

The sequences of stacking in the first and second switches describe layers that are sequentially stacked in the same direction, so the first substrate 110 of the first switch and the third substrate 130 of the second switch are positioned in the same plane, and the third substrate 130 of the first switch and the second substrate 120 of the second switch are positioned in the same plane.

That is, the first switch and the second switch have oppositely stacked structures. In particular, assuming that the first substrate 110 or the second substrate 120 connected to a battery is a first side and the third substrate 130 connected to a motor is a second side, the first switch and the second switch have the same stacking sequence (semiconductor chip-common electrode). However, when the switches are installed, any one of the first switch and the second switch is turned upside down such that the stacking sequences are opposite to each other.

As the first switch and the second switch are installed to have opposite stacking sequences, interference between the first semiconductor chip 210 and the second semiconductor chip 220 is minimized, so the power module can be manufactured in a more compact size.

Further, the components of the first and second switches are bonded by inserting a solder material 40 between the components and soldering them. For example, as for the first switch, solder materials 40 are inserted between the first substrate 110, the first semiconductor chip 210, the common electrode 300, and the third substrate 130 and then soldered.

The detailed configuration of the solder material 40 or the soldering is not included in the scope of the present invention, so it is not described herein.

Further, the components may be bonded by methods other than soldering, and for example, sintering may be used.

The first substrate 110 may be made wider than the third substrate 130 in the first switch and the third substrate 130 may be made wider than the second substrate 120 in the second switch in order to ensure spaces for bonding the wires. Even though the areas of the substrates are partially reduced, it does not greatly influence the performance of the power module, so it is possible to adjust the areas of the substrates in order to make it easy to bond the wires.

The first switch and the second switch may be sealed by a sealant 70 made of an epoxy-molding compound or a silicon gel in order to prevent movement of the first and second switches and prevent corrosion of the switches due to external air or moisture.

Another embodiment of the present invention is described hereafter.

Figure 4:
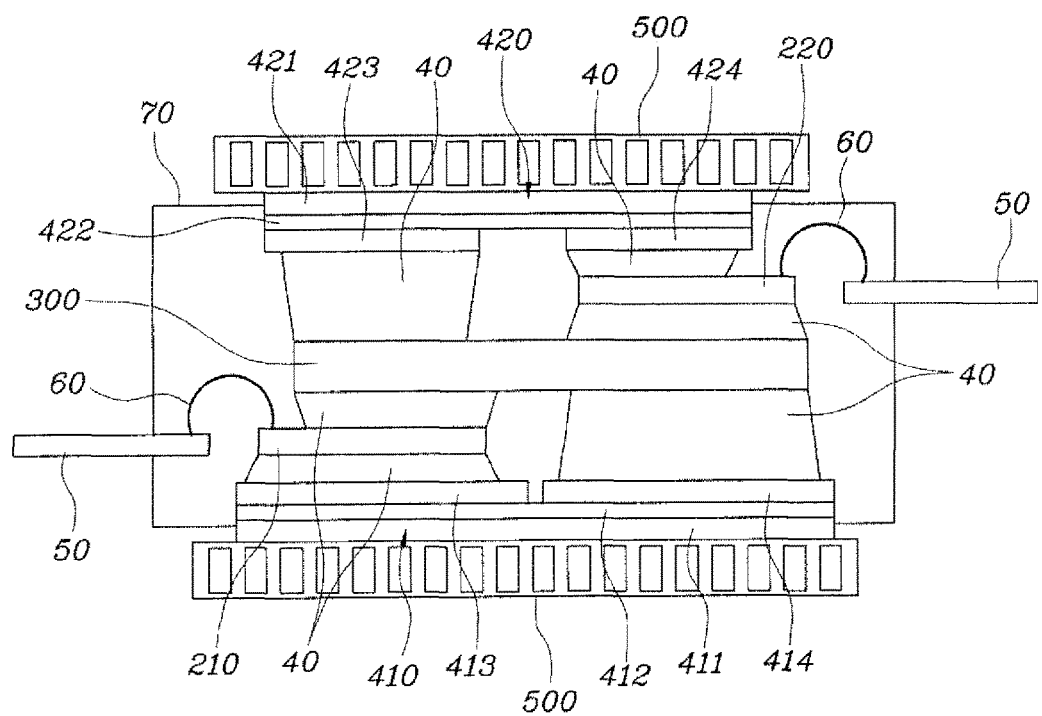
FIG. 4 is a view of a double-faced cooling-type power module according to another embodiment of the present invention.

This embodiment is characterized in that, as shown in FIGS. 3 and 4, a first substrate 110 of a first switch and a third substrate 130 of a second switch are integrated, and a third substrate 130 of the first switch and a second substrate 120 of the second switch are integrated.

For the convenience of description, the first substrate 110 of the first switch and the third substrate 130 of the second switch that are integrated are referred to as a lower substrate 410, which the third substrate 310 of the first switch and the second substrate 120 of the second switch that are integrated are referral to as an upper substrate 420.

The lower substrate 410 and the upper substrate 420 are each composed of an outer layer, an intermediate layer, and an inner layer. The outer layer and the inner layer are made of aluminum or copper to be able to transmit/receive electrical signals, while the intermediate layer is made of ceramic for insulation.

The lower substrate 410 is composed of an outer layer 411, an intermediate layer 412, a first switch-side inner layer 413, and a second switch-side inner layer 414, in which the outer layer 411 and the intermediate layer 412 are integrated and the inner layer is divided and bonded to the first switch and the second switch, respectively.

Since the inner layer is divided, it is possible to achieve the same effect as the previous embodiment in which the first substrate 110 and the third substrate 130 are separated. Further, since the outer layer and the inner layer are integrated, resistance to physical deformation can be increased.

In the upper substrate 420, similarly, an outer layer 421 and an intermediate layer 422 are integrated and an inner layer is divided into a first switch-side inner layer 423 and a second switch-side inner layer 424, so it operates similar to the lower substrate 410.

It is advantageous to ensure spaces for bonding wires 600 by making the upper substrate 420 smaller in area than the lower substrate 410.

Although exemplary embodiments of the present invention have been described above with reference to the accompanying drawings, those skilled in the art would understand that the present invention may be implemented in various ways without changing the necessary features or the spirit of the prevent invention.

Therefore, it should be understood that the exemplary embodiments are not limiting but illustrative in all aspects. The scope of the present invention is defined not by the specification, but by the following claims, and all changes and modifications obtained from the meaning and range of claims and equivalent concepts should be construed as being included in the scope of the present invention.

What is claimed is:

1. A double-facing cooling-type power module, comprising:
    a first switch having coolers on both sides;
    a second switch disposed independently from the first switch and having the coolers on both sides; and
    a common electrode coupled to both the first switch and the second switch,
    wherein the first switch is formed by stacking a first semiconductor chip and the common electrode between a first substrate and a third substrate,
    wherein the second switch is formed by stacking the common electrode and a second semiconductor chip between the third substrate and a second substrate,
    wherein the common electrode is stacked in both the first switch and the second switch,
    wherein the common electrode is disposed apart from the first to third substrates,
    wherein the first semiconductor chip is disposed on a bottom side of the common electrode and the second semiconductor chip is disposed on a top side of the common electrode.

2. The power module of claim 1, wherein the first switch and the second switch are formed in opposite shapes, and the first substrate of the first switch and the third substrate of the second switch are positioned in the same plane.

3. The power module of claim 1, wherein the first substrate, the first semiconductor chip, the common electrode, and the third substrate of the first switch are bonded by soldering, and
    the third substrate, the common electrode, the second semiconductor chip, and the second substrate of the second switch are bonded by soldering.

4. The power module of claim 1, wherein the first substrate of the first switch and the third substrate of the second switch are separate substrates, and
    the third substrate of the first switch and the second substrate of the second switch are separate substrates.

5. The power module of claim 4, wherein the first substrate is made wider than the third substrate in the first switch, and
    the third substrate is made wider than the second substrate in the second switch.

6. The power module of claim 1, wherein the first, second, and third substrates are each composed of an outer layer made of copper or aluminum, an inner layer made of copper or aluminum and being in contact with the first semiconductor chip, the second semiconductor chip, or the common electrode, and an intermediate layer made of ceramic between the outer layer and the inner layer, the outer layer and the intermediate layer are integrated and the inner layer is divided, in the first substrate of the first switch and the third substrate of the second switch, and the outer layer and the intermediate layer are integrated and the inner layer is divided, in the third substrate of the first switch and the second substrate of the second switch.

7. The power module of claim 6, wherein a substrate formed by integrating the first substrate of the first switch and the third substrate of the second switch is made wider than a substrate formed by integrating the third substrate of the first switch and the second substrate of the second switch.

8. The power module of claim 1, wherein the first switch and the second switch are sealed by a sealant made of an epoxy-molding compound or a silicon gel.

9. The power module of claim 1, further comprising wires connected to the first semiconductor chip and the second semiconductor chip, respectively, to transmit and receive signals.

10. The power module of claim 1, wherein the common electrode is a lead frame or a thin plate made of copper or aluminum.

* * * * *